United States Patent
Wan et al.

(10) Patent No.: US 12,543,283 B2
(45) Date of Patent: Feb. 3, 2026

(54) FRAME AND ELECTRONIC DEVICE

(71) Applicant: Honor Device Co., Ltd., Shenzhen (CN)

(72) Inventors: Weijian Wan, Shenzhen (CN); Xingbin Lu, Shenzhen (CN); Zibin Xu, Shenzhen (CN); Zhaoxu Chen, Shenzhen (CN); Chao Wang, Shenzhen (CN); Hang Chen, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 175 days.

(21) Appl. No.: 18/576,498

(22) PCT Filed: Aug. 31, 2023

(86) PCT No.: PCT/CN2023/116112
§ 371 (c)(1),
(2) Date: Jan. 4, 2024

(87) PCT Pub. No.: WO2024/114002
PCT Pub. Date: Jun. 6, 2024

(65) Prior Publication Data
US 2025/0098094 A1     Mar. 20, 2025

(30) Foreign Application Priority Data
Nov. 28, 2022   (CN) .......................... 202211498086.6

(51) Int. Cl.
*H05K 5/06* (2006.01)
*H04M 1/02* (2006.01)

(52) U.S. Cl.
CPC .......... *H05K 5/069* (2013.01); *H04M 1/0249* (2013.01); *H04M 1/026* (2013.01)

(58) Field of Classification Search
CPC .... H05K 5/069; H05K 5/0017; H05K 5/0217; H04M 1/026; H04M 1/0249
(Continued)

(56) References Cited

U.S. PATENT DOCUMENTS

| 5,721,404 A | 2/1998 | Toedtman |
| 2007/0293281 A1* | 12/2007 | Nogueiras ............. H04M 1/026 |
| | | 455/575.1 |

FOREIGN PATENT DOCUMENTS

| CN | 108882606 A | 11/2018 |
| CN | 106696178 B | 12/2018 |

(Continued)

*Primary Examiner* — Hung S. Bui
(74) *Attorney, Agent, or Firm* — Leydig, Voit & Mayer, Ltd.

(57) ABSTRACT

This application relates to a frame and an electronic device. The frame includes a first body and a second body. The first body includes a sealing surface, and the second body includes a flow-blocking part sunken toward one side. An extension surface of the sealing surface intersects the flow blocking part in a first direction. Because the flow blocking part is designed, in a plastic injection process, a pressure of injected plastic on the first body is reduced, to ensure that, after sealing processing is performed on the sealing surface of the first body, the plastic does not continuously flow in the first direction. This ensures sealing reliability of the sealing surface, improves sealing effect of the first body, enables the first body and the second body to be bound well, and ensures smooth manufacturing of the frame.

16 Claims, 6 Drawing Sheets

(58) Field of Classification Search
USPC .................................. 361/752, 796, 800, 728
See application file for complete search history.

(56) References Cited

FOREIGN PATENT DOCUMENTS

| | | | | |
|---|---|---|---|---|
| CN | 211842876 U | 11/2020 | | |
| CN | 212436055 U | 1/2021 | | |
| CN | 213485309 U | 6/2021 | | |
| CN | 213645792 U | 7/2021 | | |
| CN | 115604385 A | 1/2023 | | |
| JP | H0291391 | * 7/1990 | ............... | H05K 7/14 |
| KR | 20170134001 A | * 12/2017 | ........... | C25D 11/246 |

* cited by examiner

FRAME AND ELECTRONIC DEVICE

CROSS-REFERENCE TO RELATED APPLICATIONS

This application is a national stage of International Application No. PCT/CN2023/116112, filed on Aug. 31, 2023, which claims priority to Chinese Patent Application No. 202211498086.6, filed on Nov. 28, 2022. The disclosures of both of the aforementioned applications are hereby incorporated by reference in their entireties.

TECHNICAL FIELD

This application relates to the technical field of electronic devices, and in particular to a frame and an electronic device.

BACKGROUND

As electronic products are continuously updated, electronic devices are increasingly lighter and thinner. Structural members of the electronic devices also need to be lighter and thinner.

The electronic device usually includes a frame jointly formed by alloy and plastic. During processing, sealing is to be performed on thin alloy at some specific positions. When sealing is performed on the thin alloy, sealing effect is poor because the alloy is excessively thin.

SUMMARY

This application provides a frame and an electronic device, to resolve a problem in the conventional technology that sealing effect is poor because alloy is excessively thin.

According to a first aspect, an embodiment of this application provides a frame. The frame includes a first body and a second body. The first body includes a sealing surface, and the second body includes a flow blocking part sunken toward one side. An extension surface of the sealing surface intersects the flow blocking part in a first direction X.

In this solution, because the flow blocking part is designed, in a process in which the second body is formed by injection, flowing plastic is blocked by a mold placed at a position of the flow blocking part, flows along a channel at a bottom end of the mold to the first body, and contacts the first body, to generate a pressure in the first direction X on the first body. After a large amount of plastic is injected, the plastic is squeezed between the first body and the flow blocking part and flows in a third direction, to finally form the second body that includes the flow blocking part. Because a part, formed between the first body and the flow blocking part, of the plastic flows in the third direction Z, a pressure of the part of the plastic on the first body in the first direction X is reduced when the plastic is injected, to ensure that, after sealing is performed on the sealing surface of the first body, the plastic does not continuously flow in the first direction, preventing plastic spreading along the sealing surface of the first body due to overflowing of plastic at a position at which the first body and the second body are bound in a processing process. This ensures sealing reliability of the sealing surface, improves sealing effect of the first body, increases a qualified rate of the frame, enables the first body and the second body to be bound well, and ensures smooth manufacturing of the frame. In addition, because the frame of this structure can reduce the pressure, on the first body in the first direction, of the plastic that forms the second body, the sealing reliability of the sealing surface of the first body can still be ensured when the first body is thin, to meet a design requirement for an ultra-thin frame.

In a possible design, the flow blocking part extends to two sides of the sealing surface in a second direction.

In this solution, in the structure design, a flow blocking range of the flow blocking part can be increased, flow blocking effect of the flow blocking part can be improved, and a channel at a bottom end of the mold can be further extended, to prevent unsmooth plastic flowing because injected plastic is blocked at the bottom end of the mold when the second body is formed, improving injection efficiency of plastic. In addition, the pressure of the plastic flowing from the bottom end of the mold to the first body can be further reduced, to enable a pressure of the injected plastic to be distributed on two sides of the sealing surface in the second direction, and to further reduce the pressure of the plastic on the first body in the first direction during injection. This enables the sealing surface to block the injected plastic more easily and prevents the injected plastic from flowing along the sealing surface under an action of the pressure, ensuring sealing reliability of the sealing surface of the first body and improving sealing effect.

In a possible design, a sunken part configured to accommodate an electronic component is formed on the first body, a protrusion adjacent to the sunken part is further formed on the first body, and the sealing surface is formed on a side, adjacent to the sunken part, of the protrusion.

In this solution, the protrusion and the sunken part are provided to enable the frame to be better attached to the electronic component and limit movement or displacement of the electronic component. This can improve installation stability of the electronic component, reduce occupation space for the electronic component, and improve system integration of the electronic device, to meet a lighter and thinner design requirement for the electronic device. The sealing surface is disposed on the side, adjacent to the sunken part, of the protrusion, to increase a pressure on the side, adjacent to the sunken part, of the protrusion for blocking the injected plastic. This prevents the injected plastic from flowing along the sealing surface under an action of the pressure, improves sealing effect of the first body, increases a qualified rate of the frame, and enables the first body and the second body to be bound well.

In a possible design, an installation hole is formed in the sunken part.

In this solution, the installation hole is formed in the sunken part, to firmly connect an electronic component installed in the sunken part to the frame by using a fastener such as a screw; to further increase an attachment degree and a connection strength between the electronic component and the sunken part, limit relative displacement of the electronic component on the frame, prevent damage caused by shaking or vibration of the electronic component relative to the frame during use of the electronic device, and improve structural stability of the electronic device. In addition, the first body is relatively thin at a position of the sunken part, to facilitate processing of the installation hole and improve processing efficiency of the frame.

In a possible design, a width of the sealing surface is W, and 0.5 mm≤W≤10 mm, and a length of the sealing surface is L, and 0.5 mm≤L≤50 mm. For example, W is 0.8 mm, 1 mm, 1.5 mm, 3 mm, or the like, and L is 0.8 mm, 3 mm, 10 mm, 20 mm, or the like. A specific size of the sealing surface 11 may be set based on a specific structure of the frame 10. This is not limited herein.

In this solution, when the width W of the sealing surface meets 0.5 mm≤W≤10 mm, and the length L meets 0.5 mm≤L≤50 mm, a size of the sealing surface is proper, and a thickness of the first body at the protrusion and the sunken part is proper. This can meet a light and thin design requirement for the frame, an overall strength design requirement for the frame, and an installation requirement for the frame for the electronic component, reduce a processing difficulty for the installation hole, enable a strength of the first body on the sealing surface to be increased, and enable a capability of resisting a pressure of the injected plastic to be increased. Therefore, when the second body is formed, the injected plastic can be prevented from spreading along the sealing surface, to improve sealing effect of the first body.

In a possible design, a bottom surface of the sunken part is higher than a bottom surface of the flow blocking part in a third direction, and the third direction is a thickness direction of the frame.

In this solution, because the flow blocking part is designed, flowing plastic is blocked by a mold, flows along a channel at a bottom end of the mold to the first body, and contacts the first body, to generate a pressure in the first direction on the first body. To be specific, the first body bears a relatively great pressure that is on a side wall on a side toward the second body, that is at a position lower than a bottom wall of the flow blocking part, and that is of injected plastic in the first direction. Therefore, in the third direction, the bottom surface of the sunken part is higher than the bottom surface of the flow blocking part. This can increase an area, in a direction toward the second body, of the first body and increase a capability of the first body for resisting a pressure of the injected plastic, effectively preventing plastic from overflowing during injection and improving sealing effect of the first body.

In a possible design, in the first direction, there is a gap between the flow blocking part and the first body, a width of the gap is N, and 0.2 mm≤N≤0.8 mm. For example, N is 0.3 mm, 0.4 mm, 0.5 mm, 0.6 mm, 0.7 mm, or the like. This is not limited herein.

In this solution, when the width N of the gap meets 0.2 mm≤N≤0.8 mm, the width N of the gap between the flow blocking part and the first body is proper. Therefore, in a process in which the second body is formed by processing, it can be ensured that the injected plastic can smoothly enter between the first body and the flow blocking part. It is ensured, when the second body can be smoothly manufactured, that there is not an excessively large amount of plastic flowing between the first body and the flow blocking part. This prevents plastic overflowing because an excessively large pressure is generated, on the first body in the first direction, by the plastic before flowing between the first body and the flow blocking part, improving sealing effect of the first body.

In a possible design, a shape of a cross-section of the flow blocking part is one of a trapezoid, a rectangle, an ellipse, a triangle, and a pentagon.

In this solution, the flow blocking part may be set to one of the trapezoid, the rectangle, the ellipse, the triangle, or the pentagon based on an arrangement requirement for an electronic component of the electronic device, to prevent interference between the frame and the electronic component and improve installation stability of the electronic component while ensuring flow blocking effect of the flow blocking part. Further, installation space for the frame can be properly allocated, space occupied by the electronic component can be reduced, system integration of the electronic device can be improved, and a lighter and thinner design requirement for the electronic device can be met.

In a possible design, a thickness of the first body is D, and 0 mm<D≤0.8 mm. For example, D may be 0.35 mm, 0.4 mm, 0.5 mm, 0.55 mm, 0.6 mm, 0.65 mm, 0.7 mm, or the like. This is not limited herein.

In this solution, when the thickness D of the first body is less than or equal to 0.8 mm, an overall thickness of the frame may be smaller, to meet a lighter and thinner design requirement for the frame. This enables the electronic device to be lighter and thinner, improving use experience of a user.

In a possible design, in the third direction, a highest surface of the first body is a first surface, and a highest surface of the second body is a second surface. The first surface and the second surface are on a same plane.

In this solution, the first surface and the second surface are on the same plane in the third direction, to ensure consistency of a position at which the first body and the second body are bound. This ensures flatness of an installation surface of the frame, increases integrity of the frame, and can increase a connection strength between the first body and the second body, to prevent damage, caused under a force in the first direction, to the position at which the first body and the second body are bound, causing separation of the first body and the second body, and increase an overall strength of the frame.

In a possible design, the first direction is a width direction of the frame, and the second direction is a length direction of the frame. Certainly, based on different reference coordinates of the electronic device, the first direction and the second direction may alternatively be other directions of the electronic device. This is not limited herein.

According to a second aspect, an embodiment of this application further provides an electronic device. The electronic device includes an electronic component and the frame described in any one of the foregoing embodiments. The electronic component is installed on the frame. Because the frame has the foregoing technical effect, the electronic device including the frame should also have corresponding technical effect. Details are not described herein again.

It should be understood that the foregoing general description and the following detailed description are merely examples, and cannot limit this application.

REFERENCE NUMERALS

1'—first body;
2'—second body;

3'—mold;
10—frame;
1—first body;
11—sealing surface;
12—sunken part;
13—installation hole;
14—protrusion;
141—first surface;
2—second body;
21—flow blocking part;
22—second surface;
20—mold;
X—first direction;
Y—second direction;
Z—third direction.

The accompanying drawings herein are incorporated into the specification and constitute a part of the specification, show embodiments conforming to this application, and are used together with the specification to explain a principle of this application.

DESCRIPTION OF EMBODIMENTS

Description of conventional technologies: In a conventional design solution for a frame of an electronic device, a limit value of sealing space for an alloy part of the frame is ensured to be 0.7 mm. For a processing hole formed on a frame with a thickness less than 0.8 mm, a shut-off difference is designed based on 45°, and a segment difference is ensured to be 0.35 mm or above. Sealing for shut-off is preferably performed in a single direction, followed by adjacent shut-off, and simultaneous shut-off in three directions is prohibited. In this design solution, a requirement for a wall thickness of the alloy part is relatively high, and the wall thickness of the alloy part is to be at least greater than 1 mm. When the wall thickness of the alloy part at a specific position is less than 1 mm, disqualification caused by plastic spreading may easily occur while sealing is performed in this method.

Figure 1:
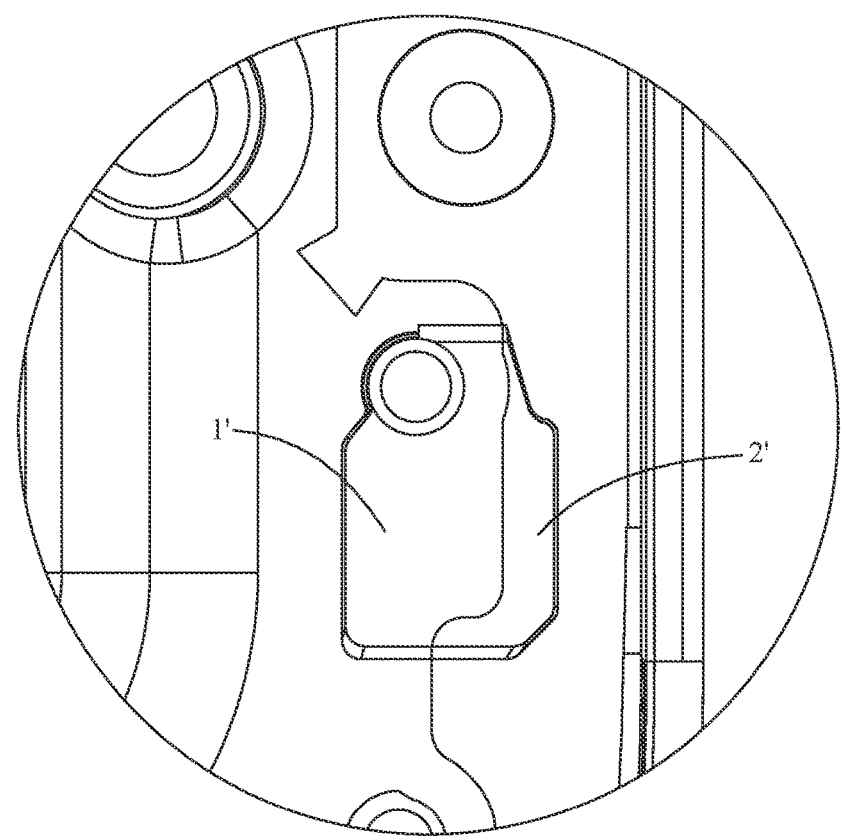
FIG. 1 is a schematic diagram of a partial structure of a frame of an electronic device in the conventional technology.
Figure 2:
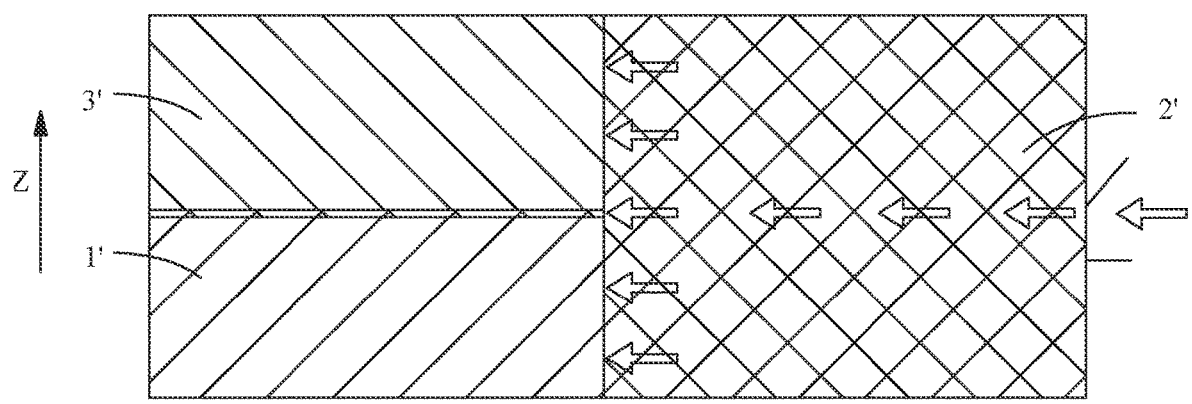
FIG. 2 is a principle diagram of a processing process of the frame in FIG. 1.

As electronic products are continuously updated, electronic devices are increasingly lighter and thinner. Structural members of the electronic devices also need to be lighter and thinner. FIG. 1 is a schematic diagram of a structure of a frame of an existing electronic device. The frame includes and is jointly formed by a first body 1' of an alloy material and a second body 2' of a plastic material. The second body 2' is formed at the first body 1' by injection. As shown in FIG. 2, during processing, because the first body 1' is excessively light and thin (for example, when a thickness of the first body 1' is less than 0.8 mm), a sealing width of the first body 1' is not large enough and cannot meet a sealing requirement for a position at which the first body 1' and the second body 2' are bound, and a pressure resistance capability is low: This causes plastic that forms the second body 2' to generate a large pressure in a direction toward the first body 1' in an injection process, and causes a part of the plastic to easily flow in a gap between a mold 3' and the first body 1' along an inner wall of the first body 1', resulting in disqualification caused by plastic spreading and affecting a qualified rate of the frame.

To resolve the foregoing technical problem, embodiments of this application provide a frame and an electronic device, to ensure, when an alloy part of the frame is relatively thin, sealing effect at a position at which the alloy part and a plastic part are bound. The electronic device in embodiments of this application includes, for example, a mobile phone, a tablet computer, an ultra-mobile personal computer (UMPC), a netbook, a cellular phone, a personal digital assistant (PDA), an augmented reality (AR) device, a virtual reality (VR) device, an artificial intelligence (AI) device, a wearable device, an in-vehicle device, a smart home device and/or a smart city device, a game handle, and any terminal electronic device that may have a frame configured to install an electronic component. A specific form of the electronic device is not specially limited in embodiments of this application. For ease of description, for example, the electronic device is a mobile phone for description.

To better understand technical solutions of this application, the following describes embodiments of this application in detail with reference to accompanying drawings.

Figure 3:
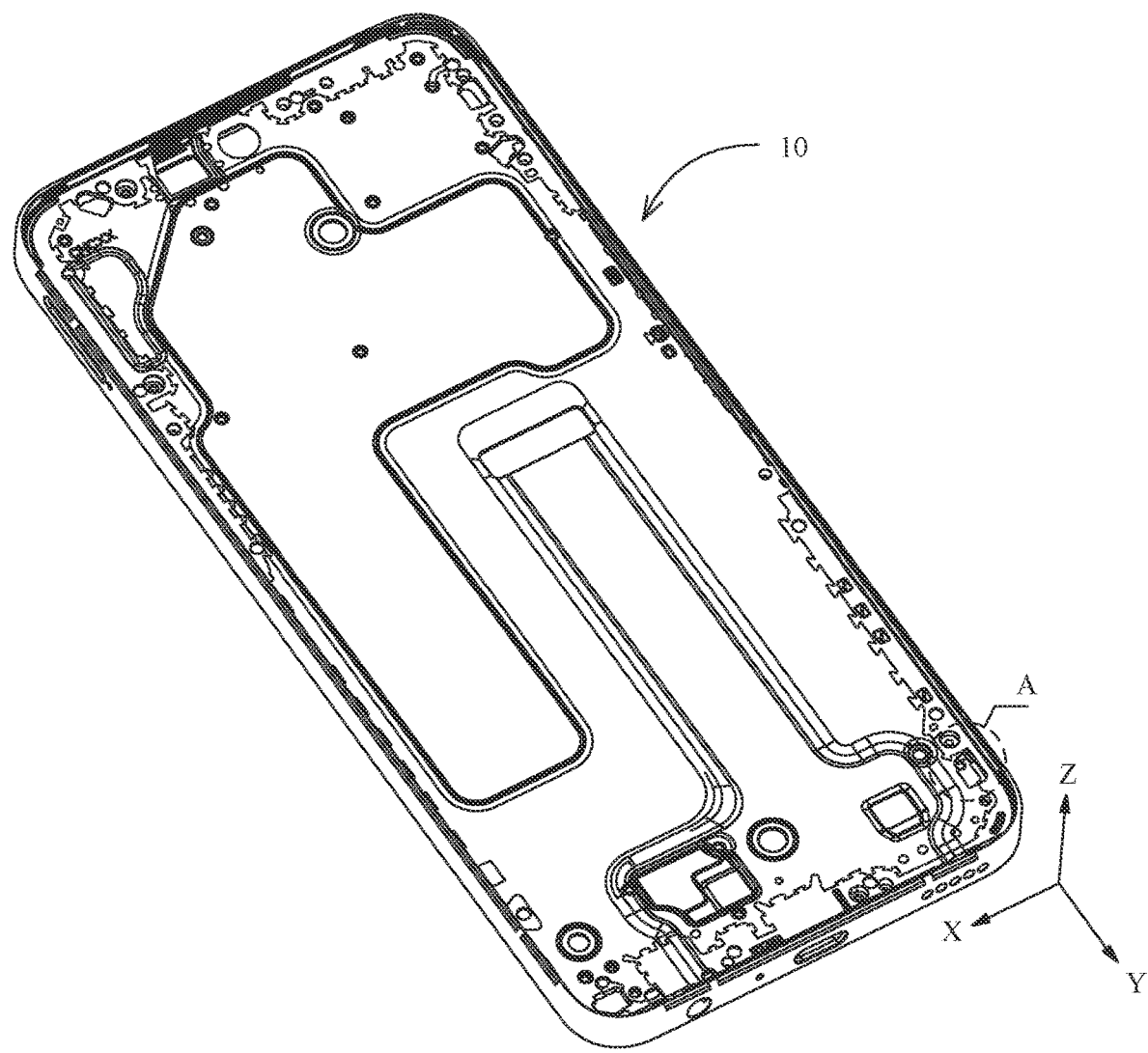
FIG. 3 is a schematic diagram of a structure of a frame of an electronic device according to an embodiment of this application.
Figure 4:
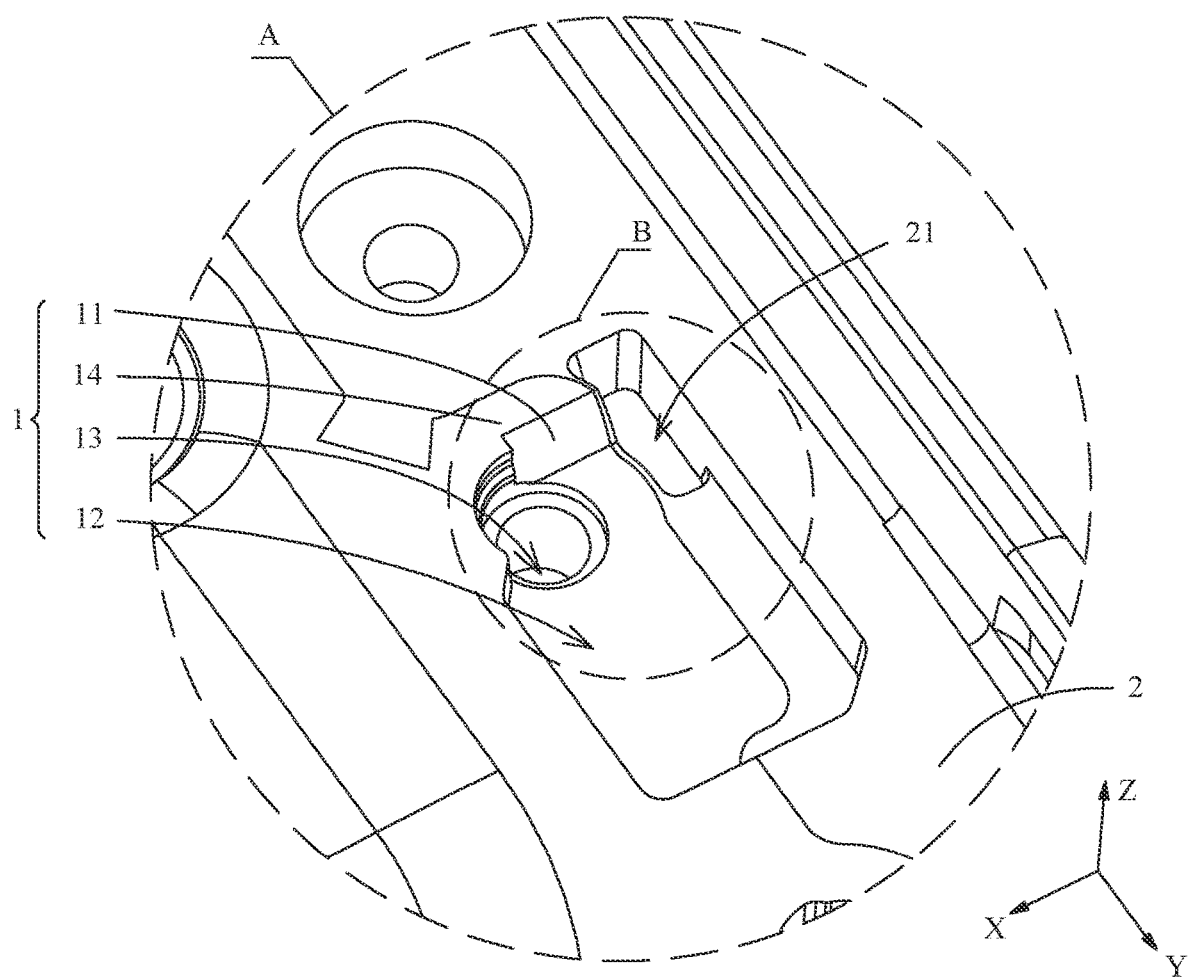
FIG. 4 is a partially enlarged view of the frame at a position A in FIG. 3.

An embodiment of this application provides a frame 10. As shown in FIG. 3 and FIG. 4, the frame 10 includes a first body 1 and a second body 2. The first body 1 includes a sealing surface 11, and the second body 2 includes a flow blocking part 21 sunken toward one side. An extension surface of the sealing surface 11 intersects the flow blocking part 21 in a first direction X. The first body 1 may be made of an alloy material, and the second body 2 may be made of a plastic material. The first body 1 and the second body 2 may alternatively be made of other materials that form the frame 10 by sealing.

Figure 5:
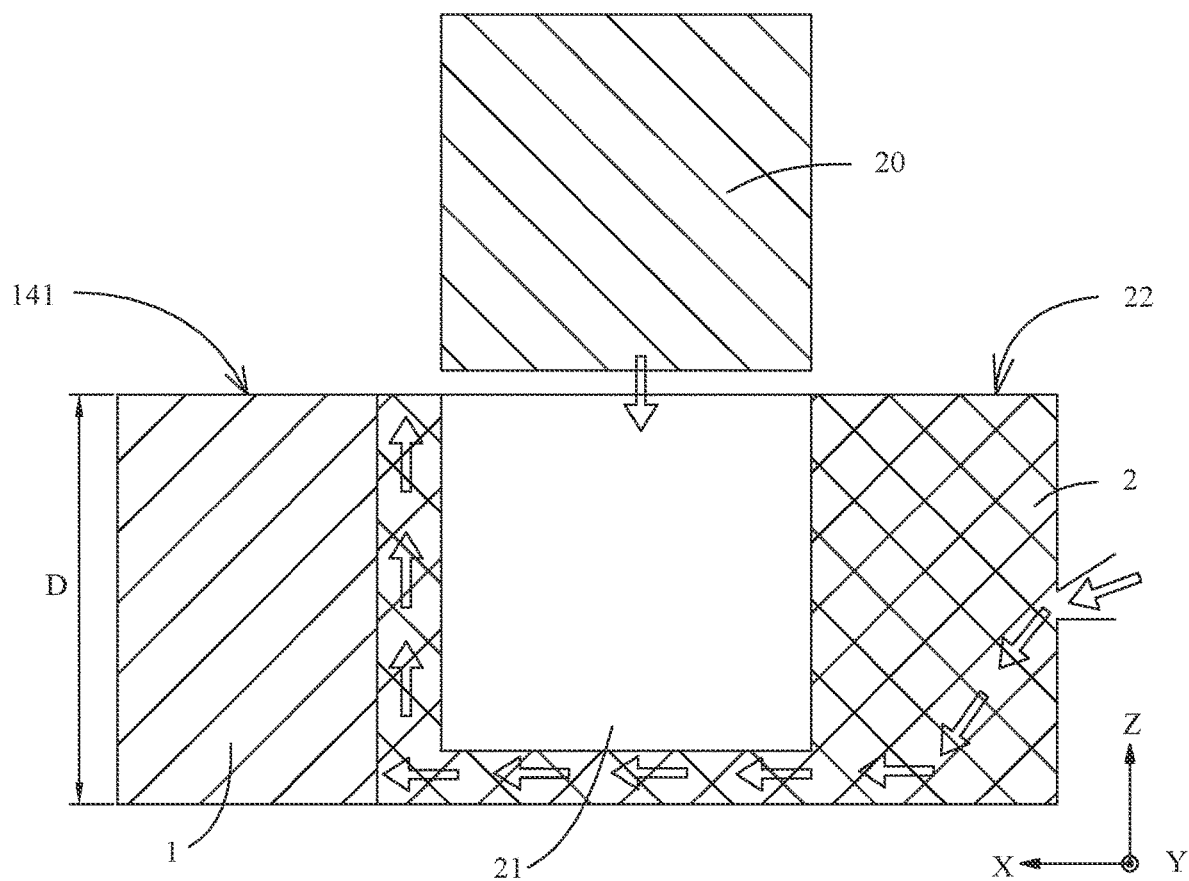
FIG. 5 is a principle diagram of a processing process of the frame in FIG. 3.

As shown in FIG. 3 to FIG. 5, in a specific implementation, the frame 10 includes and is jointly formed by the first body 1 of the alloy material and the second body 2 of the plastic material, and the second body 2 is formed at the first body 1 by injection. During processing, sealing is performed on the sealing surface 11 by using a sealing mold, and fastening is performed by using a mold 20 at a position at which the second body 2 is formed. Then, plastic is injected to form the second body 2 that includes the flow blocking part 21, and the sealing mold and the mold 20 are removed to form the frame 10.

In this embodiment, as shown in an arrow direction in FIG. 5, because the flow blocking part 21 is designed, in a process in which the second body 2 is formed by injection, flowing plastic is blocked by the mold 20 placed at a position of the flow blocking part 21, flows along a channel at a bottom end of the mold 20 to the first body 1, and contacts the first body 1, to generate a pressure in the first direction X on the first body 1. After a large amount of plastic is injected, the plastic is squeezed between the first body 1 and the flow blocking part 21 and flows in a third direction Z, to finally form the second body 2 that includes the flow blocking part 21. Because a part, formed between the first body 1 and the flow blocking part 21, of the plastic flows in the third direction Z, a pressure of the part of the plastic on the first body 1 in the first direction X is reduced when the plastic is injected, to ensure that, after sealing is performed on the sealing surface 11 of the first body 1, the plastic does not continuously flow in the first direction X, preventing plastic spreading along the sealing surface 11 of the first body 1 due to overflowing of plastic at a position at which the first body 1 and the second body 2 are bound in a processing process. This ensures sealing reliability of the sealing surface 11, improves sealing effect of the first body 1, increases a qualified rate of the frame 10, enables the first body 1 and the second body 2 to be well bound, and ensures smooth manufacturing of the frame 10. In addition, in a manufacturing process of the frame 10 of the structure, the pressure, on the first body 1 in the first direction X, of the plastic forming the second body 2 can be reduced, to still ensure the sealing reliability of the sealing surface 11 of the first body 1 when the first body 1 is thin, and meet a design requirement for the ultra-thin frame 10.

In this embodiment of this application, two of the first direction X, the second direction Y, and the third direction Z are roughly perpendicular to each other. The first direction X may be a width direction of the frame 10, and the second direction Y may be a length direction of the frame 10. Certainly, the first direction X may alternatively be the length direction of the frame 10, and correspondingly, the second direction Y is the width direction of the frame 10.

In this embodiment of this application, a pressure of injected plastic in a processing process can be reduced by using the frame 10, and when a screw hole is sealed at a position of an elastic piece in a liquid crystal display (LCD) compartment, plastic blocking the screw hole and disqualification caused by plastic spreading during injection can be prevented. Further, the solution may also be applied to the following situation: When a processing hole at the frame 10 has a large shut-off angle (for example, designed with a shut-off angle greater than) 45° and a large drop (for example, a drop is increased from 0.2 mm to 0.4 mm), the processing hole is prevented from being blocked by the plastic because the plastic spreads during injection, and a processing hole of an infrared alarm system at the frame is prevented from being blocked. This is not limited herein.

Figure 6:
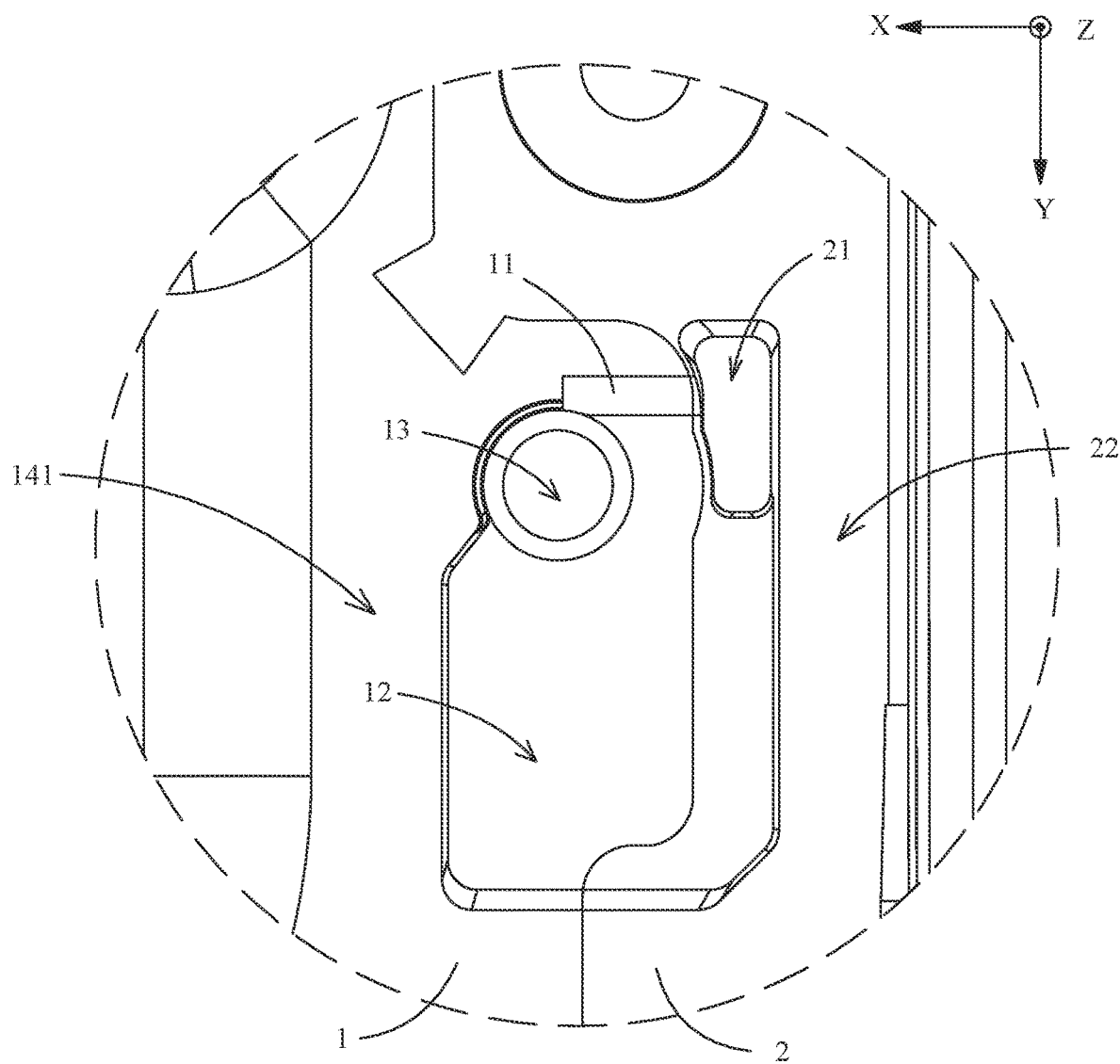
FIG. 6 is a schematic diagram of a partial structure of the frame in FIG. 1 at another angle.
Figure 7:
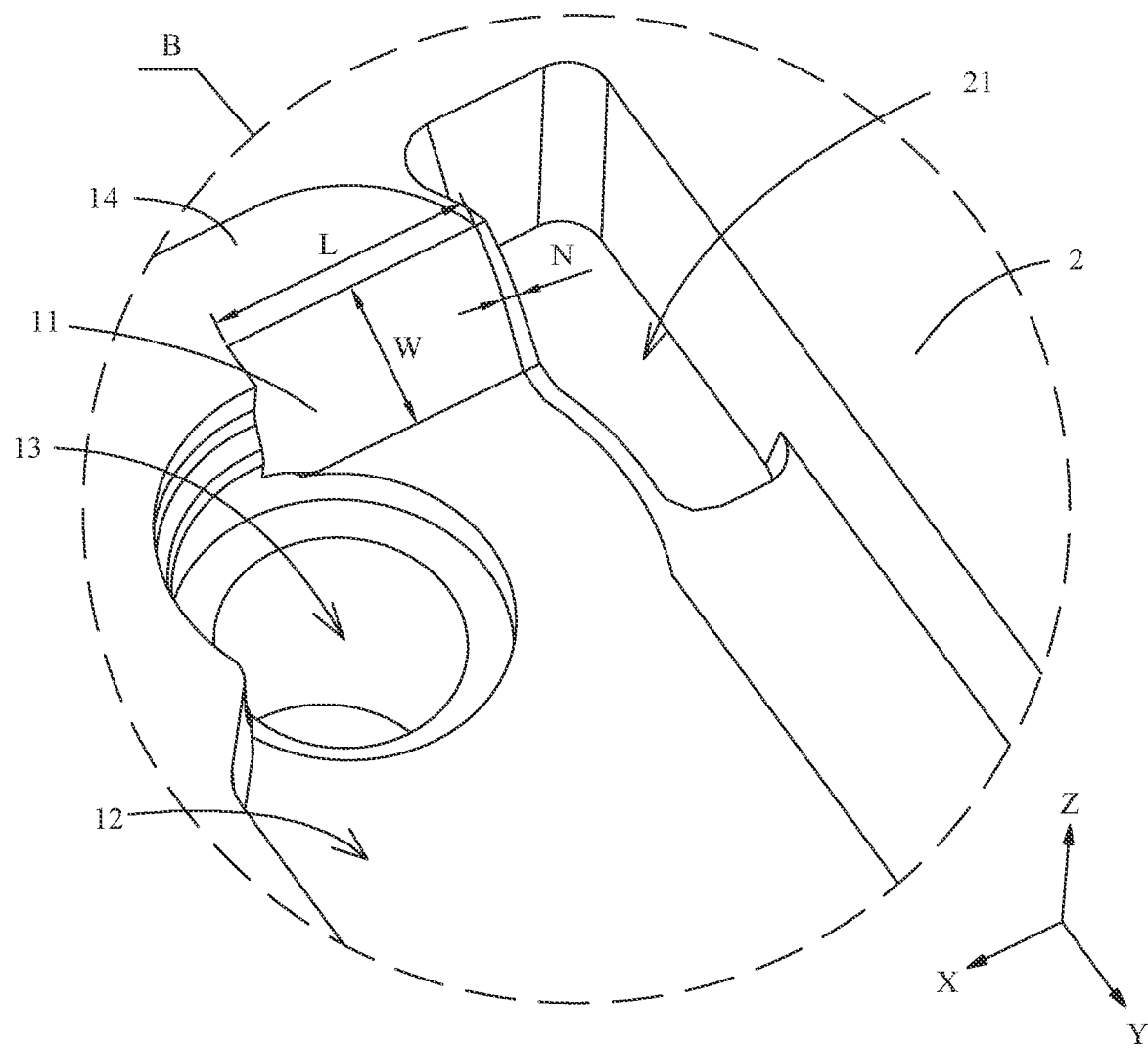
FIG. 7 is a partially enlarged view at a position B in FIG. 4.

In a specific embodiment, as shown in FIG. 6 and FIG. 7, in the second direction Y, the flow blocking part 21 extends to two sides of the sealing surface 11.

In this embodiment, as shown in FIG. 5 to FIG. 7, in the structure design, a flow blocking range of the flow blocking part 21 can be increased, flow blocking effect of the flow blocking part 21 can be improved, and a channel at a bottom end of the mold 20 can be further extended, to prevent unsmooth plastic flowing because injected plastic is blocked at the bottom end of the mold 20 when the second body 2 is formed, improving injection efficiency of plastic. In addition, the pressure of the plastic flowing from the bottom end of the mold 20 to the first body 1 can be further reduced, to enable a pressure of the injected plastic to be distributed on two sides of the sealing surface 11 in the second direction Y, and to further reduce the pressure of the plastic on the first body 1 in the first direction X during injection. This enables the sealing surface 11 to block the injected plastic more easily and prevents the injected plastic from flowing along the sealing surface 11 under an action of the pressure, ensuring sealing reliability of the sealing surface 11 of the first body 1 and improving sealing effect.

In a specific embodiment, as shown in FIG. 6 and FIG. 7, a shape of a cross-section of the flow blocking part 21 is one of a trapezoid, a rectangle, an ellipse, a triangle, and a pentagon.

In this embodiment, as shown in FIG. 6 and FIG. 7, the cross-section of the flow blocking part 21 may be set to one of the trapezoid, the rectangle, the ellipse, the triangle, or the pentagon based on an arrangement requirement for an electronic component of the electronic device, to prevent interference between the frame 10 and the electronic component and improve installation stability of the electronic component while ensuring flow blocking effect of the flow blocking part 21. Further, installation space for the frame 10 can be properly allocated, space occupied by the electronic component can be reduced, system integration of the electronic device can be improved, and a lighter and thinner design requirement for the electronic device can be met.

In this embodiment, the cross-section of the flow blocking part 21 is a surface formed by cutting the flow blocking part 21 in the first direction X.

In the specific embodiment shown in FIG. 6 and FIG. 7, the flow blocking part 21 is an approximately trapezoidal structure and is distributed on two sides of the sealing surface 11 in a second direction Y, to be adapted to installation of the electronic component of the electronic device in this embodiment.

Certainly, the flow blocking part 21 may alternatively be of another shape or a combination of a plurality of shapes, to be further accommodated to an installation requirement for the electronic component. This is not limited herein.

In a specific embodiment, as shown in FIG. 4, FIG. 6, and FIG. 7, a sunken part 12 configured to accommodate an electronic component is formed on the first body 1, and a protrusion 14 adjacent to the sunken part 12 is further formed on the first part 1, and the sealing surface 11 is formed on one side, adjacent to the sunken part 12, of the protrusion 14.

In this embodiment, as shown in FIG. 4, FIG. 6, and FIG. 7, the protrusion 14 and the sunken part 12 are provided to enable the frame 10 to be better attached to the electronic component and limit movement or displacement of the electronic component. This can improve installation stability of the electronic component, reduce occupation space for the electronic component, and improve system integration of the electronic device, to meet a lighter and thinner design requirement for the electronic device. When plastic of the second body 2 is formed by injection, injected plastic generates a large positive pressure on the first body 1. The sunken part 12 is provided to enable the injected plastic to spread along one side, adjacent to the sunken part 12, of the protrusion 14 more easily. Therefore, the sealing surface 11 is disposed on the side, adjacent to the sunken part 12, of the protrusion 14, to increase a pressure on the side, adjacent to the sunken part 12, of the protrusion 14 for blocking the injected plastic. This prevents the injected plastic from flowing along the sealing surface 11 under an action of the pressure, improves sealing effect of the first body 1, increases a qualified rate of the frame 10, and enables the first body 1 and the second body 2 to be bound well.

In a specific embodiment, as shown in FIG. 4, FIG. 6, and FIG. 7, an installation hole 13 is formed in the sunken part 12.

In this embodiment, as shown in FIG. 4, FIG. 6, and FIG. 7, the installation hole 13 is formed in the sunken part 12 to firmly connect an electronic component installed in the sunken part 12 to the frame 10 by using a fastener such as a screw; to further increase an attachment degree and a connection strength between the electronic component and the sunken part 12, limit relative displacement of the electronic component on the frame 10, prevent damage caused by shaking or vibration of the electronic component relative to the frame 10 during use of the electronic device, and improve structural stability of the electronic device. In addition, the first body 1 is relatively thin at a position of the sunken part 12, to facilitate processing of the installation hole 13 and improve processing efficiency of the frame.

The installation hole 13 may alternatively be connected to the electronic component by embedding, snap-in, or the like. This is not limited herein.

In addition, as shown in FIG. 6 and FIG. 7, the installation hole 13 is provided at one end, away from the second body 2 in the first direction X, of the sunken part 12 of the first body 1. This can enable the installation hole 13 to be away from a position at which the first body 1 and the second body 2 are bound, to prevent injected plastic from flowing into the installation hole 13, causing the installation hole 13 to be blocked. Therefore, a qualified rate of the frame 10 is increased.

In a specific embodiment, as shown in FIG. 7, a width of the sealing surface 11 is W, 0.5 mm≤W≤10 mm, and a length of the sealing surface 11 is L, and 0.5 mm≤L≤50 mm. For example, W is 0.8 mm, 1 mm, 1.5 mm, 3 mm, or the like, and L is 0.8 mm, 3 mm, 10 mm, 20 mm, or the like. A specific size of the sealing surface 11 may be set based on a specific structure of the frame 10. This is not limited herein.

As shown in FIG. 7, the width W and the length L of the sealing surface 11 should not be excessively large or excessively small. If the width W of the sealing surface 11 is excessively large, namely, W>10 mm, space occupied by the sealing surface 11 in the third direction Z is easily excessively large. This enables the first body 1 to be excessively thick at the protrusion 14, which is not conducive to a light and thin design for the frame 10. Alternatively, this enables the first body 1 to be excessively thin at a position of the sunken part 12, which is not conducive to a strength design for the frame 10. If the width W of the sealing surface 11 is excessively small, namely, W<0.5 mm, space occupied by the sealing surface 11 in the third direction Z is easily excessively small. This enables the sunken part 12 to be not deep enough, is not conducive to limitation of the electronic component and a light and thin design for the electronic device, and increases a processing difficulty for the installation hole 13. If the length L of the sealing surface 11 is excessively large, namely, L>50 mm, space occupied by the sealing surface 11 in a length direction of the sealing surface 11 is easily excessively large, and a size of the frame 10 is increased, which is not conducive to a miniaturization design for the electronic device. If the length L of the sealing surface 11 is excessively small, that is, L<0.5 mm, space occupied by the sealing surface 11 in a length direction of the sealing surface 11 is excessively small. This enables a sealing strength of a sealing mold on the sealing surface 11 to be reduced and a capability of resisting a pressure of injected plastic to be reduced, causing disqualification caused by plastic spreading because the injected plastic easily flows along the sealing surface 11, when the second body 2 is formed.

In this embodiment, as shown in FIG. 7, when the width W of the sealing surface 11 meets 0.5 mm≤W≤10 mm, and the length L meets 0.5 mm≤L≤50 mm, a size of the sealing surface 11 is proper, and a thickness of the first body 1 at the protrusion 14 and the sunken part 12 is proper. This can meet a light and thin design requirement for the frame 10, an overall strength design requirement for the frame 10, and an installation requirement for the frame 10 for the electronic component, reduce a processing difficulty for the installation hole 13, enable a strength of the first body 1 on the sealing surface 11 to be increased, and enable a capability of resisting a pressure of the injected plastic to be increased. Therefore, when the second body 2 is formed, the injected plastic can be prevented from spreading along the sealing surface 11, to improve sealing effect of the first body 1.

The length direction of the sealing surface 11 is the same as an injection direction of the plastic forming the second body 2. This can increase the capability of the sealing surface 11 for resisting a pressure of the injected plastic and further improve the sealing effect of the first body 1. In the specific embodiment shown in FIG. 7, the length direction of the sealing surface 11 is the first direction X. Certainly, when the injection direction of the plastic forming the second body 2 is a different direction, it is only ensured that the length direction of the sealing surface 11 is the same as the injection direction of the plastic forming the second body 2. This is not limited herein.

Certainly, when the solution in this embodiment is applied to another small electronic device or another large electronic device, a size of the sealing surface 11 may be designed based on a specific size of the frame of the electronic device. For example, when the solution is applied to frame processing of a small electronic device, a width W of the small electronic device may be less than 0.5 mm, a length L may be less than 0.5 mm, or the like. When the solution is applied to frame processing of a large electronic device, a width W of the large electronic device may be greater than 10 mm, and a length L may be greater than 50 mm. This is not limited herein.

In a specific embodiment, as shown in FIG. 4, FIG. 6, and FIG. 7, a bottom surface of the sunken part 12 is higher than a bottom surface of the flow blocking part 21 in a third direction Z, and the third direction Z is a thickness direction of the frame 10.

In this embodiment, as shown in an arrow direction in FIG. 5, because the flow blocking part 21 is designed, flowing plastic is blocked by the mold 20, flows along a channel at the bottom end of the mold 20 to the first body 1, and contacts the first body 1, to generate a pressure in the first direction X on the first body 1. To be specific, the first body 1 bears a relatively great pressure, that is on a side wall on a side toward the second body 2, that is at a position lower than a bottom wall of the flow blocking part 21, and that is of injected plastic in the first direction X. Therefore, in the third direction Z, the bottom surface of the sunken part 12 is higher than the bottom surface of the flow blocking part 21. This can increase an area, in a direction toward the second body 2, of the first body 1 and increase a capability of the first body 1 for resisting a pressure of the injected plastic, effectively preventing plastic from overflowing during injection and improving sealing effect of the first body 1.

In a specific embodiment, as shown in FIG. 4 to FIG. 7, in the first direction X, there is a gap between the flow blocking part 21 and the first body 1, a width of the gap is N, and 0.2 mm≤N≤0.8 mm. For example, N is 0.3 mm, 0.4 mm, 0.5 mm, 0.6 mm, 0.7 mm, or the like. This is not limited herein.

In this embodiment, as shown in FIG. 4 to FIG. 7, the gap between the flow blocking part 21 and the first body 1 should not be excessively large or excessively small. If the width N of the gap is excessively large, that is, N>0.8 mm, excessively much plastic is pressed between the flow blocking part 21 and the first body 1 in the third direction Z, and a large pressure is still generated on the first body 1 in the first direction X. This easily causes injected plastic to flow along the surface of the first body 1, causing overflowing and reducing the qualified rate of the frame 10. If the width N of the gap is excessively small, that is, N<0.2 mm, space between the first body 1 and the flow blocking part 21 is excessively small. Therefore, in a process in which the second body 2 is formed by processing, injected plastic is not easily pressed between the first body 1 and the flow blocking part 21, causing plastic to accumulate at a bottom of the flow blocking part 21. This is not conducive to processing and forming of the second body 2 and reduces a processing yield of the frame 10.

Therefore, when the width N of the gap meets 0.2 mm≤N≤0.8 mm, the width N of the gap between the flow blocking part 21 and the first body 1 is proper. Therefore, in a process in which the second body 2 is formed by processing, it can be ensured that the injected plastic can smoothly enter between the first body 1 and the flow blocking part 21. It is ensured that, when the second body 2 can be smoothly manufactured, there is not an excessively large amount of plastic flowing between the first body 1 and the flow blocking part 21. This prevents plastic overflowing because an excessively large pressure is generated, on the first body 1 in the first direction X, by the plastic before flowing between the first body 1 and the flow blocking part 21, improving sealing effect of the first body 1.

In a specific embodiment, as shown in FIG. 4 and FIG. 5, a thickness of the first body 1 is D, and 0 mm<D≤0.8 mm. For example, D may be 0.35 mm, 0.4 mm, 0.5 mm, 0.55 mm, 0.6 mm, 0.65 mm, 0.7 mm, or the like. This is not limited herein.

In this embodiment, as shown in FIG. 4 and FIG. 5, when the thickness D of the first body 1 is less than or equal to 0.8 mm, an overall thickness of the frame 10 may be smaller, to meet a lighter and thinner design requirement for the frame 10. This enables the electronic device to be lighter and thinner, improving use experience of a user.

Certainly, the thickness D of the first body 1 may alternatively be designed as another value based on a specific design for the electronic device. This is not limited herein.

In a specific embodiment, as shown in FIG. 4 to FIG. 7, in the third direction Z, a highest surface of the first body 1 is a first surface 141, and a highest surface of the second body 2 is a second surface 22. The first surface 141 and the second surface 22 are on a same plane.

In this embodiment, as shown in FIG. 4 to FIG. 7, in the third direction Z, the first surface 141 and the second surface 22 are on the same plane, to ensure consistency of a position at which the first body 1 and the second body 2 are bound. This ensures flatness of an installation surface of the frame 10, increases integrity of the frame 10, and increases a connection strength between the first body 1 and the second body 2, to prevent damage, caused under a force in the first direction X, to the position at which the first body 1 and the second body 2 are bound, causing separation of the first body 1 and the second body 2, and increase an overall strength of the frame 10.

In a specific embodiment, as shown in FIG. 4 to FIG. 7, the first direction X is a width direction of the frame 10, and the second direction Y is a length direction of the frame 10. Certainly, based on different reference coordinates of the electronic device, the first direction X and the second direction Y may alternatively be other directions of the electronic device. This is not limited herein.

An embodiment of this application further provides an electronic device. The electronic device includes an electronic component and the frame 10 in any one of the foregoing embodiments. The electronic component is installed on the frame 10. Because the frame 10 has the foregoing technical effect, the electronic device including the frame 10 should also have corresponding technical effect. Details are not described herein again.

It should be noted that a part of the application document of this patent includes copyright-protected content. A copyright owner reserves the copyright except copies made for the patent document or the recorded content of the patent document in the China National Intellectual Property Administration.

What is claimed is:

1. A frame, comprising:
a first body comprising a sealing surface; and
a second body comprising a flow blocking part sunken toward one side, wherein:
an extension surface of the sealing surface intersects the flow blocking part in a first direction;
the flow blocking part extends to two sides of the sealing surface in a second direction;
a sunken part configured to accommodate an electronic component is formed on the first body, and an installation hole is formed in the sunken part;
a bottom surface of the sunken part is higher than a bottom surface of the flow blocking part in a third direction; and
the third direction is a thickness direction of the frame.

2. The frame according to claim 1,
wherein a protrusion adjacent to the sunken part is further formed on the first body; and
wherein the sealing surface is formed on a side, adjacent to the sunken part, of the protrusion.

3. The frame according to claim 1,
wherein a width of the sealing surface is W, and 0.5 mm≤W≤10 mm; and
wherein a length of the sealing surface is L, and 0.5 mm≤L≤50 mm.

4. The frame according to claim 1,
wherein there is a gap between the flow blocking part and the first body in the first direction; and
wherein a width of the gap is N, and 0.2 mm≤N≤0.8 mm.

5. The frame according to claim 1, wherein a shape of a cross-section of the flow blocking part is one of a trapezoid, a rectangle, an ellipse, a triangle, or a pentagon.

6. The frame according to claim 1, wherein a thickness of the first body is D, and 0 mm<D≤0.8 mm.

7. The frame according to claim 1,
wherein in the third direction, a highest surface of the first body is a first surface, and a highest surface of the second body is a second surface; and
wherein the first surface and the second surface are on a same plane.

8. The frame according to claim 1, wherein the first direction is a width direction of the frame, and the second direction is a length direction of the frame.

9. An electronic device, comprising:
an electronic component; and
a frame, wherein the electronic component is installed on the frame;
wherein the frame comprises:
a first body comprising a sealing surface; and
a second body comprising a flow blocking part sunken toward one side;
wherein an extension surface of the sealing surface intersects the flow blocking part in a first direction;
wherein the flow blocking part extends to two sides of the sealing surface in a second direction;
wherein a sunken part configured to accommodate an electronic component is formed on the first body, and an installation hole is formed in the sunken part;
wherein a bottom surface of the sunken part is higher than a bottom surface of the flow blocking part in a third direction; and
wherein the third direction is a thickness direction of the frame.

10. The electronic device according to claim 9,
wherein a protrusion adjacent to the sunken part is further formed on the first body; and
wherein the sealing surface is formed on a side, adjacent to the sunken part, of the protrusion.

11. The electronic device according to claim 9,
wherein a width of the sealing surface is W, and 0.5 mm≤W≤10 mm; and
wherein a length of the sealing surface is L, and 0.5 mm≤L≤50 mm.

12. The electronic device according to claim 9,
wherein there is a gap between the flow blocking part and the first body in the first direction; and
wherein a width of the gap is N, and $0.2 \text{ mm} \leq N \leq 0.8 \text{ mm}$.

13. The electronic device according to claim 9, wherein a shape of a cross-section of the flow blocking part is one of a trapezoid, a rectangle, an ellipse, a triangle, or a pentagon.

14. The electronic device according to claim 9, wherein a thickness of the first body is D, and $0 \text{ mm} < D \leq 0.8 \text{ mm}$.

15. The electronic device according to claim 9,
wherein in the third direction, a highest surface of the first body is a first surface, and a highest surface of the second body is a second surface; and
wherein the first surface and the second surface are on a same plane.

16. The electronic device according to claim 9, wherein the first direction is a width direction of the frame, and the second direction is a length direction of the frame.

\* \* \* \* \*